United States Patent [19]

Dickie

[11] Patent Number: 5,053,926
[45] Date of Patent: Oct. 1, 1991

[54] ELECTRONIC EQUIPMENT CABINET COVER PANEL WITH INTEGRATED CONNECTOR ASSEMBLY

[75] Inventor: Robert G. Dickie, Newmarket, Canada

[73] Assignee: Voice Data Image Corporation Inc., King City, Canada

[21] Appl. No.: 437,245

[22] Filed: Nov. 16, 1989

[51] Int. Cl.⁵ .............................................. H05K 9/00
[52] U.S. Cl. ...................................... 361/424; 439/79
[58] Field of Search ............... 174/35 R, 35 C, 35 GC; 361/395, 399, 422, 424; 439/59, 60, 62, 64, 79, 607, 608, 609

[56] References Cited

U.S. PATENT DOCUMENTS

| | | | |
|---|---|---|---|
| Re. 32,760 | 10/1988 | Chandler et al. | 439/188 |
| 4,401,355 | 8/1983 | Young | 439/607 |
| 4,619,494 | 10/1986 | Noorily et al. | 439/188 |
| 4,723,196 | 2/1988 | Hofmeister et al. | 361/399 |
| 4,808,115 | 2/1989 | Norton et al. | 361/395 |

Primary Examiner—Leo P. Picard
Assistant Examiner—Donald A. Sparks
Attorney, Agent, or Firm—Robert O. Nimtz

[57] ABSTRACT

An electronic equipment cabinet is shown having an integrated cover panel which provides a plurality of connector receptacle positions to which outside equipment may be connected. Connector contacts are snap locked into the receptacle positions. The connector receptacle contacts are automatically bridged when the mating connector plug is removed to short circuit the connector contacts. L-shaped bridging contacts maintain positional stability while L-shaped connector contacts permit direct insertion of the contacts into a printed circuit board within the equipment cabinet. Two unitary ground strips are fashioned to provide shielding shrouds around each of the plurality of connector receptacles while attaching as single units to the cover panel and closing ground contact with the cabinet housing. This cabinet arrangement finds one use as a trunk access unit to interconnect a plurality of data stations into a local area ring network.

17 Claims, 4 Drawing Sheets

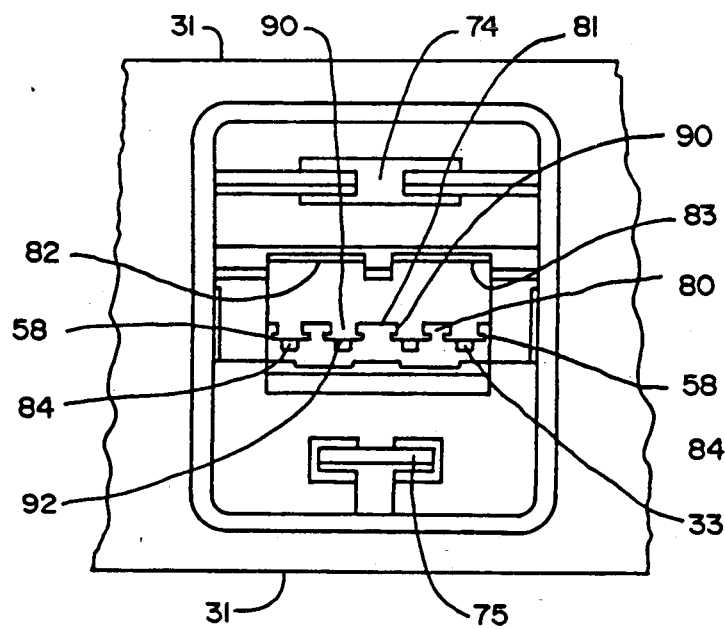
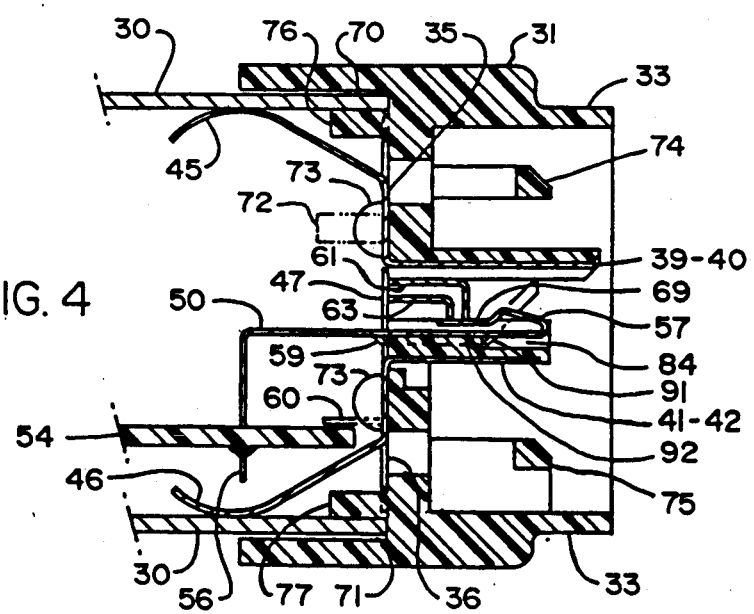

ELECTRONIC EQUIPMENT CABINET COVER PANEL WITH INTEGRATED CONNECTOR ASSEMBLY

TECHNICAL FIELD

This invention relates to electrical connector assemblies and, more particularly, to electronic cabinet cover panels with integrated electrical connector assemblies which are less costly to fabricate and assemble.

BACKGROUND OF THE INVENTION

Electronic equipment is often connected to other electronic equipment or to transmission facilities by means of multiconductor connectors. Such connectors are fabricated in mating pairs, one male and one female, which fit together to complete an electrical circuit between each of the conductors of one connector and the corresponding conductor of the other connector. For many applications, it is further necessary to provide electromagnetic and/or electrostatic shielding around the conductors to prevent the unwanted leakage of electromagnetic energy. Due to the necessity of providing all of these functions for a plurality of conductors, the design of such connectors has been complicated and required the assembly of many different parts, thereby increasing the cost and complexity of such connector assemblies. In some applications, the design of multiconductor connectors is aggravated by the need to provide a large number of such connectors in close proximity to each other. One such application is in a central connection box for local area data networks.

Many local area networks (LANs) have a ring architecture in which a plurality of stations are connected together in a ring. Messages are then transmitted from one station to another around the ring, using address information in the message header to deliver the messages to the proper destination. In such local area networks, such as within a single building, it is convenient to interconnect stations in a star network, with a central connection point, and with stations connected to such a central point by way of trunk transmission lines. In order to realize a ring network with a star architecture, it is necessary to route both an outgoing and an incoming trunk line between each station and the central point. At the central point, the trunk line terminations are interconnected into a serial ring. The various timing, framing and control circuits for enabling ring transmissions are also located at the central location. Finally, the central connection point is arranged to ensure ring transmission continuity in the absence of one or more stations from the star network. Such a central interconnection circuit is commonly known as a trunk access unit (TAU).

It will be noted that a trunk access unit includes many parts, both electronic and mechanical. The mechanical parts, and, in particular, the connectors which are used to connect the stations to the network must provide connections for the two trunk lines (four conductors) going to each station. Moreover, these connectors must provide bridging contacts which automatically connect the outgoing trunk line contacts to the incoming trunk line contacts when the station connector is unplugged from the TAU unit. Connections must also be provided from the trunk line terminations to central control circuitry, preferable mounted on a printed circuit board (PCB) mounted in the TAU. Due to the high data rate normally used in such networks, the connector contacts must be shielded to prevent interference from signals leaking from the different trunk lines terminating in the TAU. As might be expected, these many functions are accommodated by connector structures and shielding structures which must be assembled in very particular relationships. In the prior art, these complicated structural relationships have been accommodated by painstaking assemblies of many small parts into subassemblies which, in turn are assembled into the final TAU assembly.

Electromagnetic shielding, for example, has been provided in the prior art by individual conductive shrouds assembled to surround each set of connector contacts and electrically mating with similar shielding shrouds forming part of the mating connector. These shrouds were typically assembled from piece parts mounted around each set of contacts, using fastening devices such as screws or rivets a costly and time-consuming operation.

The connectors themselves typically comprise several non-conductive housing pieces into which are assembled the contact pins and around which the shielding shrouds are secured. Finally, all of the shielded connector assemblies are assembled into a cover panel closing one face of an electronics cabinet. It can thus be seen that the fabrication of shielded connectors for access to electronic equipment cabinets involves the assembly of large numbers of parts involving many separate subassembly steps, thereby increasing the cost and reducing the reliability of the resulting assemblage. Lower cost and more reliable electronic equipment cabinets (such as TAUs) would result from reducing the number of parts required to be assembled in order to provide such equipment cabinets.

SUMMARY OF THE INVENTION

In accordance with the illustrative embodiment of the present invention, a simple and reliable electronics equipment cabinet construction is provided for terminating multiple conductor connectors. Rather than following the usual construction technique of providing a plurality of access holes in a metallic chassis, one for each of the individual connectors, one entire face of the chassis is left open and a non-conductive, molded cover panel is used to close the open face of the chassis. Molded directly into the cover panel are the mounting supports for a plurality of snap-in connector contact pins as well as a mounting surface for metallic shielding shrouds surrounding the contact pins and completing the ground shield to the chassis housing. Finally, one end of each contact pin is formed and oriented for direct insertion into a soldering hole in a printed wiring board (PWB), thereby avoiding the necessity of soldering individual wires from the contact pins to the PWB.

In the event that a plurality of connector plugs must be terminated in the same equipment cabinet, as is required for the Trunk Access Unit (TAU) of a Local Area Network (LAN) with a ring architecture, all of the connector contact pin mountings for all of the connectors are molded into the same cover panel. Moreover, the shielding shrouds for all of the connector conductors are fabricated by using one or two conductive strips, progressively stamped to form a plurality of shrouds, one for each of the plurality of connectors, yet comprising only one or two piece parts requiring separate assembly steps.

In the case of a trunk access unit for a local area ring network, for example, a multiple connector box must provide a plurality of shielded receptacles for connection to each of a plurality of trunk line terminating plugs. In order to provide shielding for all of the contacts in all of the connector receptacles of the TAU, two continuous conductive ground strips are fabricated to provide a separate shielding shroud around each set of contacts and yet comprise a single, continuous ground plane which can be placed, as a unit, in contact with the conductive housing or chassis around the printed circuit board. Continuous shielding around all of the data line contact pins is thereby maintained with only a pair of ground plane strips, thereby reducing the cost and complexity of the TAU assembly. For ease in assembly, these ground strips are attached to the interior of a integral, nonconductive, molded cover plate for the TAU circuit box such that individual foursided shrouds are formed for each connector position.

In further accord with the illustrative embodiment of the present invention, the single molded cover panel also provides a plurality of connector receptacle positions each adapted to receive one multi-conductor connector plug from outside equipment. Each receptacle contact pin is designed to be snap locked over shoulders molded into grooves in the interior of the cover panel. Together, these contacts form a connector receptacle assembly for contacting the pins of a mating connector plug. The other end of each contact pin is formed and oriented for direct insertion into a soldering hole in a printed wiring board within the electronic cabinet.

In accordance with one feature of the present invention, the connector end of the contact pin is bent back on itself to provide contact surfaces at the free end having elastic freedom of movement in the plane of the contact pin. This free end is formed into a ramp-shaped brushing contact surface which makes contact with a mating ramp-shaped brushing contact surface on a connector pin in a mating connector plug. The free end of the contact pin also has a flat contact surface which is normally urged into engagement with a bridging contact. That is, when the mating connector contact pin is in engagement with the receptacle contact pin, the brushing contact on the ramp portion of the receptacle pin depresses the flat surface away from the bridging contact, breaking the bridging circuit. When the mating connector plug is removed from the receptacle, however, the flat surface of the receptacle contact pin, under the influence of the spring elasticity, is allowed to return to the bridging contact and thereby close the bridging circuit.

In accordance with yet another feature of the present invention, in order to insure positional stability of the bridging contacts, and hence reliable bridging action, bridging contact strips are formed with shoulders parallel to the contact surface and locked into the molded cover panel at right angles to the direction of motion of the receptacle contact pins. In this way, the contact pressure does not tend to dislodge the bridging contact or change the contact spacing and a high degree of dimensional stability is maintained.

In summary, the interior of the molded cover plate serves as a mounting surface for both the receptacle connector contact pins, for the bridging contact strips and for the shielding shrouds. Once the receptacle connector contact pins, the bridging contact strips, and ground strips, re mounted in the cover plate, the free ends of the nector contact pins can be soldered directly to the printed circuit board. The entire assembly of cover plate, contacts, grounding strips and printed circuit board can then be mounted in the electronic box with the cover plate covering the remaining open side of the circuit box and providing a plurality of shielded female connector receptacles for mating with shielded male connector plugs.

One of the major advantages of a trunk access unit in accordance with the present invention is the formation of shielding shrouds for a plurality of connector receptacles with only two grounding strips which can be pre-assembled to the cover plate to significantly reduce assembly time and cost. Another advantage of the present invention is the ability to directly solder the receptacle connector contact pins to the printed circuit board, thereby avoiding the need for interconnecting leads. Finally, the forming of the bridging contact strips with shoulders parallel to the contact surface substantially reduces the positional instabilities of the bridging contacts. Such instabilities can result in poor electrical contact or no contact at all, thereby rendering the entire ring network unusable.

Most importantly, however, is the ability to provide one or more multiconductor shielded connectors for an electronic equipment cabinet by molding the support structures for contact pins, shielding shrouds and, if necessary, bridging contacts, all in the same integral cover panel which closes a single open face in the equipment cabinet. The number and complexity of the assembly steps necessary to fabricate equipment cabinets in accordance with the present invention is significantly less than those required in the prior art.

BRIEF DESCRIPTION OF THE DRAWINGS

A complete understanding of the present invention may be gained by considering the following detailed description in conjunction with the accompanying drawings, in which:

FIG. 4 shows a partial cross-sectional view of the assembled electronic cabinet showing the connector receptacle portion of the cover panel of FIG. 2.

FIG. 6 shows a front elevational view of one of the female connector receptacles in the cover plate as shown in FIGS. 2, 3, and 4.

To facilitate reader understanding, identical reference numerals are used to designate elements common to the figures.

DETAILED DESCRIPTION

Figure 1:
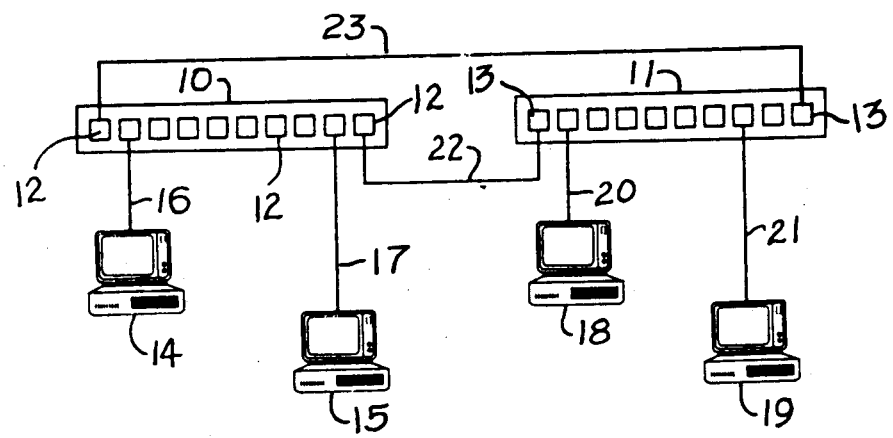
FIG. 1 shows a simplified circuit diagram of a ring data network in which the improved multiple access equipment cabinet according to the present invention may be used.

Before proceeding to a detailed description of the present invention, a typical application will be described in which a plurality of multiconductor connectors terminate in a single electronic cabinet. Referring more specifically to FIG. 1, there is shown a general block diagram of a local area ring network comprising two trunk access units (TAUs) 10 and 11 each providing a plurality 12 and 13, respectively, of connector receptacle positions. A plurality of data station units 14–15 are connected to trunk access unit 10 by way of transmission lines 16–17, terminated in male connector plugs each mating with one of the connector receptacle positions 12 of TAU 10. Similarly, a second plurality of data station units 18–19 are connected to trunk access unit 11 by way of transmission lines 20–21, terminating in male connector plugs each mating with one of the connector receptacle positions of TAU 11.

TAU 10 and TAU 11 each comprise a multiconductor, multiconnector electronic cabinet which are interconnected together to form a ring by way of transmission lines 22 and 23, each connected between connector receptacles at one end of TAU 10 and one end of TAU 11. TAUs 10 and 11 include electronic circuitry, preferable mounted on a printed circuit board, which, among other things, interconnects the multiplicity of connector positions in series to maintain the ring architecture. To this end, each of transmission lines 16–17 and 20–21 actually comprise two transmission lines, one outgoing transmission line to the associated station unit and one incoming transmission line back from the associated station unit.

In accordance with common practice, the connector receptacle positions on TAUs 10 and 11 are arranged to bridge the incoming and outgoing transmission lines when the male connector plug is removed from the connector receptacle position, thus maintaining the ring architecture regardless of how many of the connector positions are unoccupied. Trunk connector plugs suitable for mating with the connector receptacles 12 and 13 of TAUs 10 and 11 are the four position data connectors coded IBM P/N4760554, available from the International Business Machines Corporation, or AMP P/N 554922-1, available from AMP, Incorporated.

In many applications, the local area ring network of FIG. 1 is located in a geographically local area such as a single building or closely spaced buildings such as on a college campus. In that case, the transmission lines 16–17, 20–21, 22 and 23 can be simple twisted telephone pairs. TAUs 10 and 11 are preferably located in equipment closets so that all of the wiring can be brought to one or more central locations. It is, of course, obvious that the data ring network can be more dispersed geographically and the transmission lines made up of coaxial cables, optical fibers or other suitable transmission media. In any case, the electronic equipment within TAUs 10 and 11 suitably prepare data signals for launching on and reception from the transmission lines actually used.

While only two trunk access units are shown in FIG. 1 for illustrative purposes, it is clear that only one need be used, or a plurality greater than two can be used, depending on the number of station units to be interconnected. As shown in FIG. 1, a fixed number of station units can be accommodated with a single TAU (eight in FIG. 1, reserving two for inter-TAU connections). In any event, the cost of such ring networks is heavily influenced by the cost of fabricating and assembling trunk access units such as units 10 and 11. The present invention comprises improved mechanical arrangements for multiple access electronic cabi..., such as trunk access units 10 and 11, which can be fabricated and assembled more quickly and less expensively than prior art cabinets.

Figure 2:
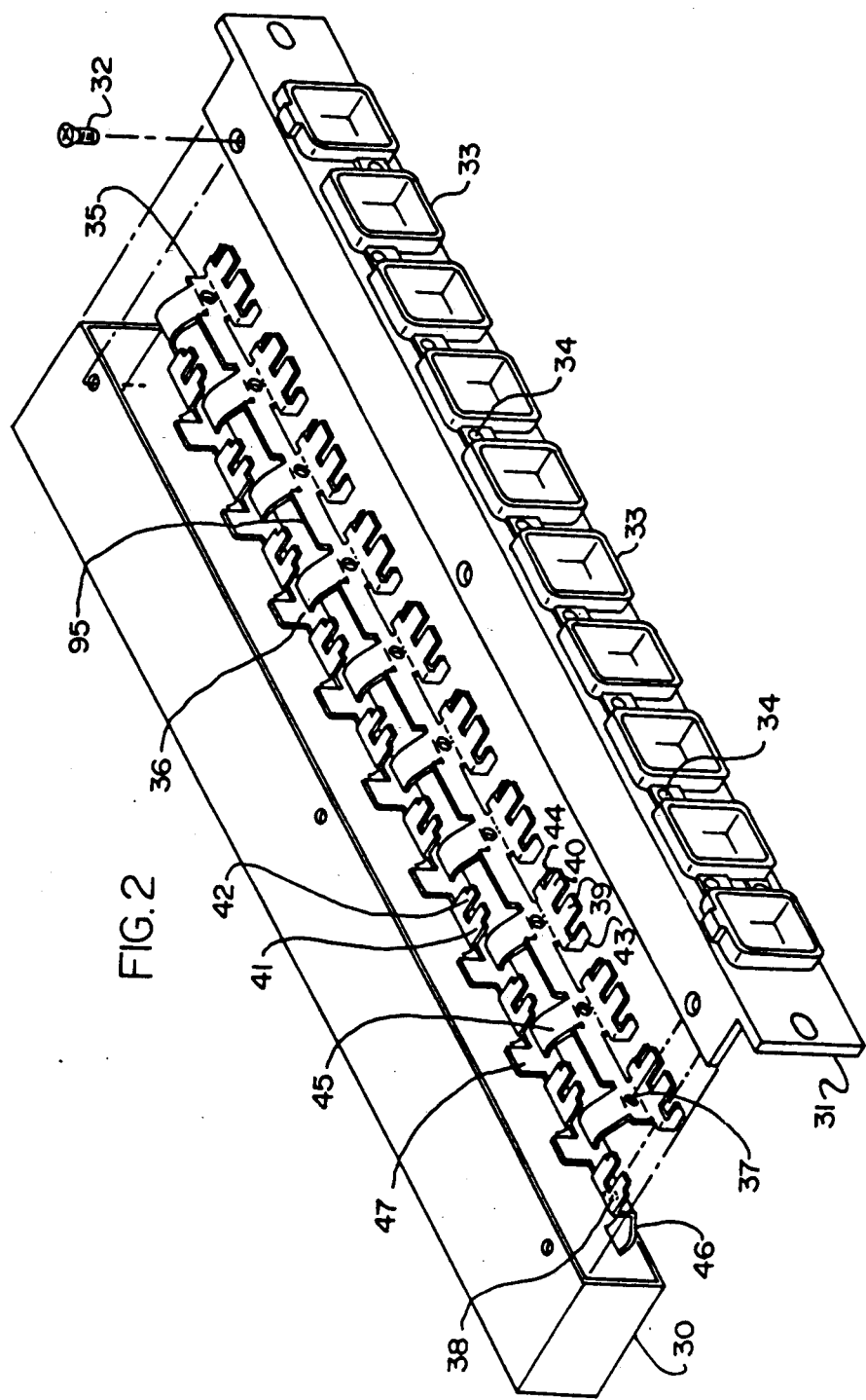
FIG. 2 shows an exploded perspective view of a portion of an electronic equipment cabinet such as a trunk access unit cabinet in accordance with the present invention showing portions of the grounding strips and cover panel assembly.

Referring more particularly to FIG. 2, there is shown a partial exploded view of the TAU 10 or 11 of FIG. 1 comprising a conductive five-sided container box or cabinet 30 for containing and shielding all of the electronic and mechanical parts of the TAU. A non-conductive, molded cover plate 31 is mounted over the open end of cabinet 30 by a plurality of self-tapping assembly screws such a screw 32. Cover plate 31 has a plurality (ten in FIG. 2) of female connector receptacle positions 33 molded therein to receive, from the rear, contacts connected to electrical circuitry within cabinet 30 and to receive, from the front, a mating connector plug from a remote station unit such as units 14 . . . 15 and 18 . . . 19 of FIG. 1. Adjacent to each of cowlings 33 is an opening 34 through which a light emitting diode (LED) can be viewed from the front to determine if the corresponding TAU circuit is operative.

An upper ground strip 35 and a lower ground strip 36 are provided with holes 37 and 38, respectively, for attaching the ground strips 35 and 36 to the interior of cover plate 31. Extensions 39 and 40 of upper ground strip 35 are positioned directly above the pairs of conductors forming the incoming and outgoing trunk lines, respectively, when the TAU unit is assembled, while extensions 41 and 42 of lower ground strip 36 are positioned directly below the pairs of conductors. Together with vertical extensions 43 and 44, extensions 39–42 form a four-sided shroud surrounding the conductors of the connector receptacle to be described below. Moreover, these conductive shrouds mate with corresponding shrouds in the mating plugs, thus insuring continuous shielding for the enclosed conductors. Upper ground springs 45 and lower ground springs 46 serve to electrically connect ground strips 35 and 36, respectively, at regular spaced intervals, to the interior of cabinet 30, thereby insuring an adequate ground connection. Vertical tabs 47 on lower ground strip 36 fit between extension 43 and the adjacent extension 44 to complete the ground shield across the open face of cabinet 30.

It will be noted that ground shrouds for a large plurality of connector receptacles are formed with only two grounding strips 35 and 36. Indeed, a single progressively stamped ground strip could be used in place of ground strips 35 and 36, but with a slight increase in assembly difficulty. In the preferred embodiment shown in the figures, a two piece grounding strip is used for convenience. This is in contrast to prior art grounding shrouds formed of at least two grounding strips for each receptacle, and requiring separate assembly around each receptacle. The multiple receptacle grounding shrouds of the present invention provide a distinct advantage in ease of assembly.

Figure 3:
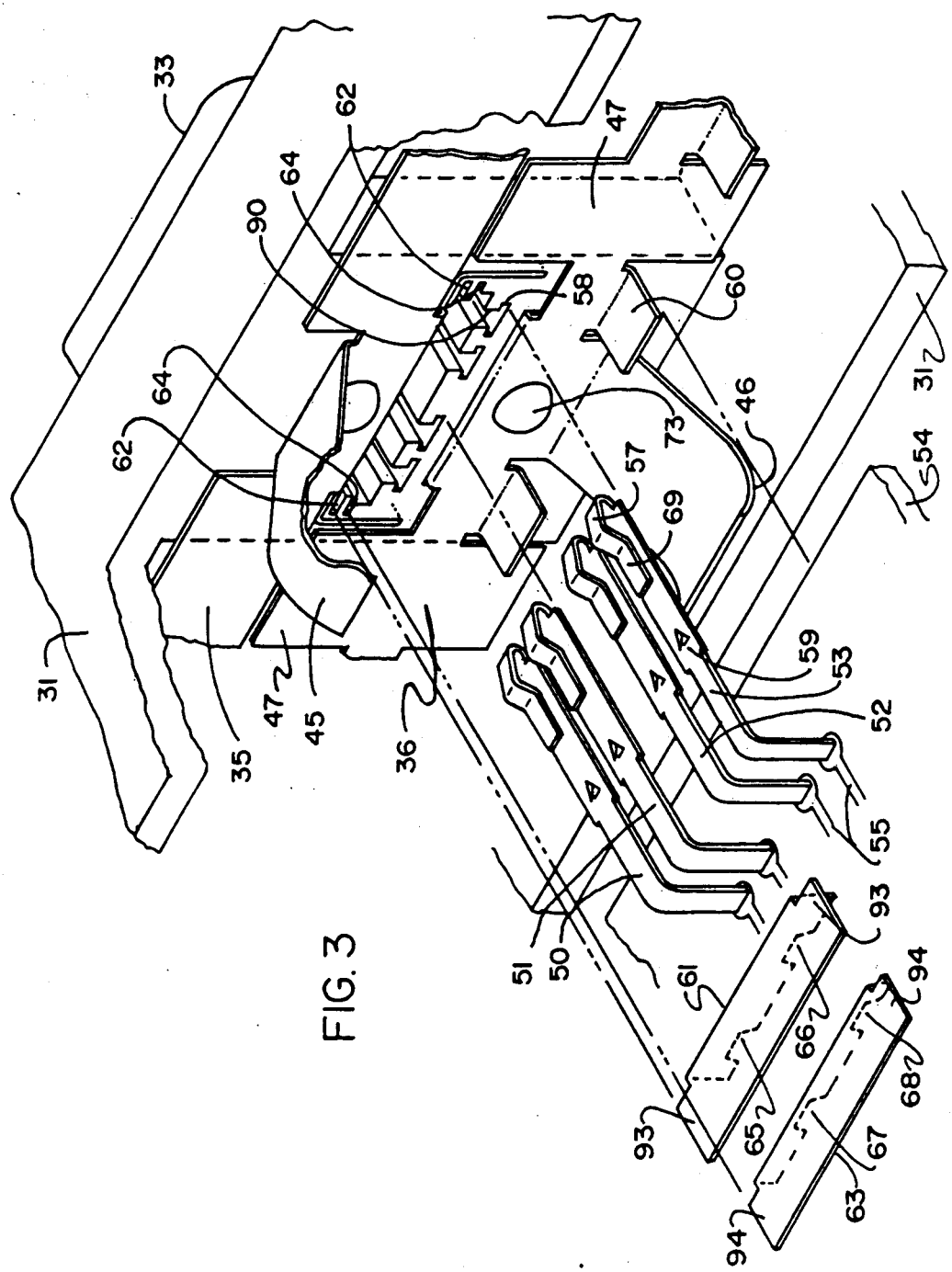
FIG. 3 shows a partial exploded perspective view of the contact assembly in the connector receptacle portion of the cover panel of FIG. 2, showing the contact arrangement and assembly in accordance with the present invention.

The details of the receptacle contacts can be better seen in FIG. 3 which is an exploded partial view of the cover panel 31 of FIG. 2 viewed from the rear so as to reveal the contact details. Each receptacle includes four line contact pins 50, 51, 52 and 53 for making contact at one end to mating contact pins on a connector plug (not shown) and for making contact at the other end to a printed wiring board 54 having printed circuit wiring 55. The contacts 50–53 are each L-shaped with a tongue 56 (best shown in FIG. 4) at one end for insertion in printed wiring board 54 and being bent back on themselves at the other end to form resilient spring contacts having a ramplike wiping contact portion 57 which makes brushing contact with similar wiping contacts on the connector plug, and a flat tail portion 69 to make contact with bridge contact elements to be described below. Connector pins 50-53 are assembled to cover panel 31 by pushing them into grooves 58. To this end, a wider central portion of each of contacts 50-53 is dimensioned to fit snugly into slot 58 while the two end portions of contacts 50-53 are narrower, dimensioned to fit through slots 90 above slots 58. The bottom of slot 58 has a shoulder 92 molded therein (FIG. 4) over which detents 59, and matching detents 91 are snapped to lock the connector contacts 50-53 into position. As also can be better seen in FIG. 4, the tabs 60 on lower ground strip 36 serve to properly position printed wiring board 54 when the parts are assembled.

It will be noted that contact pins 50-53 are L-shaped to facilitate direct connection of the contact pins into the printed wiring board 54. Such direct connection to the printed wiring board, in contrast to the prior art technique of running wires from the ends of the contact pins to the printed wiring board, greatly simplifies the assembly of the TAU.

An upper front bridging contact 61 has horizontal shoulders 93 which fit into horizontal grooves 62 in cover panel 31 while a lower rear bridging contact 63 has similar horizontal shoulders 94 which fit into horizontal grooves 64 in cover panel 31. When assembled, bridging contact 61 interconnects tail portions 69 of contacts 51 and 53 while bridging contact 63 interconnects tail portions 69 of contacts 50 and 52. Cutouts 65 and 66 in front bridge 61 prevent bridge 61 from engaging contacts 50 and 52 while cutouts 67 and 68 in rear bridge 63 prevent bridge 63 from engaging contacts 51 and 53.

It will be noted that the bridging contacts 61 and 63 are assembled into cover panel 31 by insertion of shoulders 93 and 94 into slots 62 and 64, respectively, which are at right angles to the direction in which contact pins 50-53 exert pressure on the bridging contacts. In contrast to prior bridging contacts, fabricated as planar plates, such contact pressure is unable to dislodge or move the bridging contacts 62 and 64, and thereby interfere with secure electrical connection.

In FIG. 4 there is shown a partial cross-sectional view of the assembled TAU through a typical connector receptacle position. The cabinet 30 is seen to engage the ground springs 45 and 46 to complete the electrical shield. The cabinet 30 fits into grooves 70 and 71 in the rear of cover panel 31. Cylindrical studs 72 fit through holes 37 and 38 in upper ground strip 35 and lower ground strip 36, respectively. These ground strips can then be attached to the rear interior of cover panel 31 by heat staking, i.e., partially melting the studs 72 to form a globs 73 of plastic material larger than the holes 37 and 38 and hence holding the ground strips 35 and 36 tightly to the cover panel 31. An upper plug locking clip 74 and a lower plug locking clip 75 serve to retain the mating connector plug in the receptacle once it is inserted. The details of locking clips 74 and 75 form no part of the present invention and will not be further described here. These locking clips are, of course, designed to mate with the aforementioned IBM P/N4760554 and AMP P/N554922-1 plugs.

The perpendicular tabs 95 of upper grounding strip 35 fit into location boss 76 in the interior of cover panel 31 for positional stability while corresponding erpendicular tabs at the bottom of lower grounding 36 fit into location boss 77 for the same purpose. As can be best seen in FIG. 4, the extensions 39-40 of upper grounding strip 35 and the extensions 41-42 of lower grounding strip 36 completely encircle the contacts 50-53 through to the front side of cover panel 31, while the side extensions 43 and 44 (FIG. 5) complete the shielding shroud.

Figure 5:
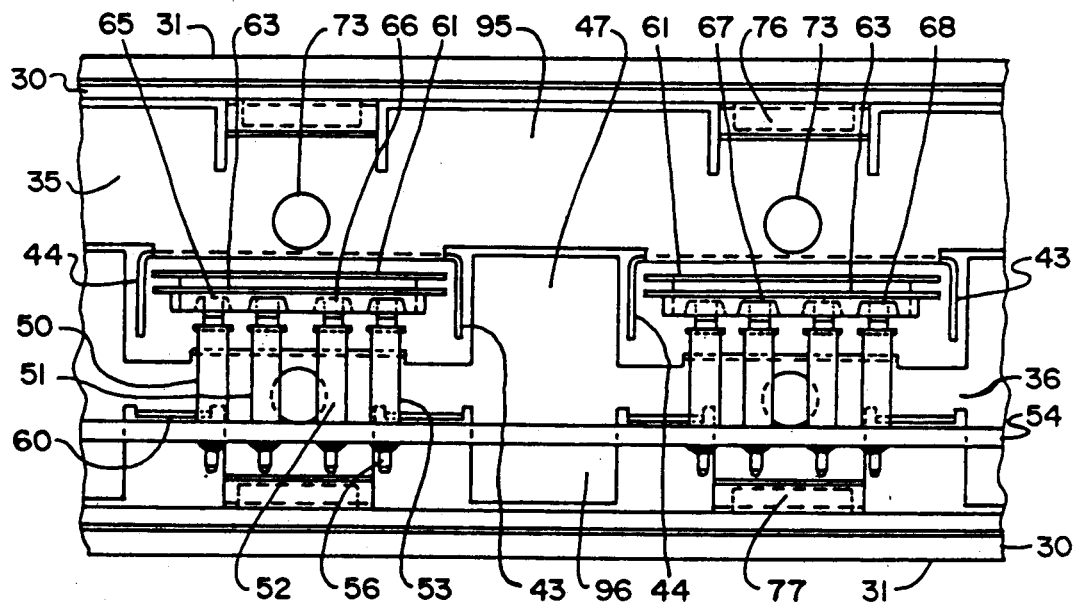
FIG. 5 shows a rear elevational view of one of a portion of the assembled electronic cabinet of FIGS. 2, 3 and 4.

In FIG. 5 there is shown a partial rear elevation view of one of the connector receptacles of the present invention showing the assembled trunk access unit. The tongues 56 are soldered into printed wiring board 54 while the upper and lower ground strips 35 and 36 are attached to cover panel 31 by melted studs 73.

In FIG. 6 there is shown a partial front elevation of the cover panel 31 showing the details of the connector pin slots 58 separated by insulated lands 80 and 81. Grooves 84 at the front end of the connector pin slots 58 form the front end of shoulders 92 and receive the mating detent on the underside of connector pins 50-53, as best shown in FIG. 4. Upper locking clip 74 and lower locking clip 75 have not been shown in detail since they form no part of the present invention. Grooves 82 and 83 receive extensions 39 and 40 of upper ground strip 37.

The trunk access unit (TAU) is assembled as follows. First, the front bridge 61 is pressed into slots 62 or cover panel 31. Then the rear bridge 63 is pressed into slots 64 of cover panel 31. Next, all of contact pins corresponding to contact pins 50-53 are soldered into printed wiring board 54 to form a first subassembly. The upper ground strip 35 and the lower ground strip 36 are then heat stamped to the rear of the cover panel 31 to form a second sub-assembly. The first and second subassemblies are then assembled to each other by pressing the contact corresponding to pins 50-53 into the slots 58, snapping the detents 59 into place, thereby forming a cover panel assembly. Finally, the entire panel cover assembly is assembled to cabinet 30 by inserting the printed wiring board 54 into the cabinet 30 and the cover panel assembly attached on the open face of cabinet 30 by means of screws 32. It is obvious that this procedure involves far fewer steps and is much less costly than prior art procedures requiring separate shrouds to be assembled for each connector receptacle and requiring individual electrical connections to be wired from each of the contact pins to the printed wiring board. Moveover, in the prior art, the cover panel itself had to be fabricated in several parts to permit the insertion of the bridging contacts.

While the illustrative embodiment of the present invention includes a plurality of integrally molded connector receptacles, it is obvious that only one such connector receptacle need be provided. Such a single receptacle embodiment would be used, for example, to provide a wall receptacle for connecting an electronic device to concealed wiring within the walls of a building.

It should also be clear to those skilled in the art that further embodiments of the present invention may be made by those skilled in the art without departing from the teachings of the present invention.

What is claimed is:

1. A housing for electronic equipment comprising
   a conductive chassis open at one end,
   a molded non-conductive cover panel for assembly to said chassis over said one end,
   a plurality of conductive receptacle contacts, said cover panel including molded supports for holding said plurality of receptacle contacts in an orientation disposed for electrical connection with plug contacts on a mating plug inserted into said cover panel from the outside of said housing, and an electromagnetic shielding element attached to the interior of said cover panel and shaped to provide shielding shrouds around said receptacle contacts, said shrouds mating with corresponding shrouds in said mating plug when said mating plug is inserted in said cover panel.

2. The housing according to claim 1 further comprising a printed wiring board disposed within said chassis, one end of each of said plurality of receptacle contacts being oriented for direct insertion into soldering holes in said printed wiring board.

3. The housing according to claim 1 further comprising at least one bridging contact disposed in said cover panel to engage at least two of said receptacle contacts when the mating plug is removed from said cover panel, said bridging contact being secured by slots in said cover panel at right angles to the direction of operation of said receptacle contacts.

4. The housing according to claim 1 wherein said plurality of receptacle contacts are arranged into a subplurality of subsets of contacts, each of said subsets being adapted to receive a different mating plug.

5. A housing for electronic equipment comprising a chassis, a molded non-conductive cover panel for assembly to said housing and having a plurality of plug receptacles molded therein, no more than two progressively stamped conductive shielding strips forming, when assembled, shrouds around the conductors of each of said plurality of electric plug receptacles, and means for attaching said shielding strips to the interior of said housing.

6. The housing according to claim 5 further comprising a plurality of conductive electrical contacts, said cover panel including in each of said plug receptacles molded supports for holding said plurality of electrical contacts in an orientation disposed for electrical connection with the electrical contacts of mating electrical plugs.

7. The housing according to claim 6 further comprising a printed wiring board disposed within said chassis, one end of each of said electrical contacts being oriented for direct insertion into a soldering hole in said printed wiring board.

8. The housing according to claim 6 further comprising at least one bridging contact disposed in said cover panel to engage at least two of said electrical connector contacts when said mating plug is removed from said cover panel, said bridging contact being secured in said cover panel by slots at right angles to the direction of closure of said electrical connector contacts.

9. A trunk access unit for local area ring networks comprising a conductive housing for said access unit closed on all but one side, a printed circuit board for holding electronic components within said conductive housing, a cover panel for closing said one side of said housing, said cover panel comprising a molded non-conductive body including a plurality of connector positions disposed longitudinally along said body, each of said connector positions including at least two L-shaped connector contacts for making contact with conductors in a mating connector plug from a station unit of said local area ring network when said mating connector plug is inserted into said connector position, said at least two connector contacts being adapted for direct insertion at one end thereof into said printed circuit board, at least one L-shaped bridging contact arranged to be contacted by two of said connector contacts when said mating connector from a station unit is removed from said connector position, and a pair of conductive grounding strips adapted for attachment to said body to form shielding shrouds around at least two of said connector positions.

10. A cover panel for an electronic equipment housing comprising a molded non-conductive cover panel body for closing one end of said housing, a plurality of conductive receptacle contacts, said cover panel body including molded supports for holding said plurality of receptacle contacts in a orientation disposed for electrical connection with plug contacts on a mating plug inserted into said cover panel, and an electromagnetic shielding element attached to the interior of said cover panel and shaped to provide shielding shrouds around said receptacle contacts, said shrouds mating with corresponding shrouds in said mating plug when said mating plug is inserted into said cover panel.

11. The cover panel according to claim 10 further comprising a printed wiring board, one end of each of said plurality of receptacle contacts being oriented for direct insertion into soldering holes in said printed wiring board.

12. The cover panel according to claim 10 further comprising at least one bridging contact disposed in said cover panel to engage at least two of said receptacle contacts when the mating plug is removed from said cover panel, said bridging contact being secured by slots in said cover panel at right angles to the direction of movement of said receptacle contacts.

13. The cover panel according to claim 10 wherein said plurality of receptacle contacts are arranged into a subplurality of subsets of contacts, each of said subsets adapted to receive a different mating plug.

14. A cover panel for electronic equipment housings comprising a molded non-conductive cover panel body having a plurality of plug receptacles molded therein, no more than two progressively stamped conductive shielding str forming, when assembled, shrouds around the conductors of said plurality of electric plug receptacles, and means for attaching said shielding strips to the interior of said cover panel body.

15. The cover panel according to claim 14 further comprising a plurality of conductive electrical contacts, said cover panel body including in each of said plug receptacles molded supports for holding said plurality of electrical contacts in an orientation disposed for electrical connection with the electrical contacts of mating electrical plugs.

16. The cover panel according to claim 14 further comprising a printed wiring board, one end of each of said electrical contacts being oriented for direct insertion into a soldering hole in said printed wiring board.

17. The cover panel according to claim 14 further comprising at least one bridging contact disposed in said cover panel body to engage at least two of said electrical connector contacts when said mating plug is removed from said cover panel, said bridging contact being secured in said cover panel body by slots at right angles to the direction of closure of said electrical contacts.

* * * * *